United States Patent
Jurgensen

(10) Patent No.: US 7,033,921 B2
(45) Date of Patent: Apr. 25, 2006

(54) METHOD AND DEVICE FOR DEPOSITING CRYSTALLINE LAYERS ON CRYSTALLINE SUBSTRATES

(75) Inventor: Holger Jurgensen, Aachen (DE)

(73) Assignee: Aixtron AG, (DE)

( * ) Notice: Subject to any disclaimer, the term of this patent is extended or adjusted under 35 U.S.C. 154(b) by 0 days.

(21) Appl. No.: 10/872,920

(22) Filed: Jun. 21, 2004

(65) Prior Publication Data
US 2005/0026402 A1    Feb. 3, 2005

Related U.S. Application Data

(63) Continuation of application No. PCT/EP02/13830, filed on Dec. 6, 2002.

(51) Int. Cl.
*H01L 21/28* (2006.01)
*H01L 21/3205* (2006.01)

(52) U.S. Cl. .................. 438/602; 438/505; 438/508; 438/478

(58) Field of Classification Search ........... 438/602, 438/505, 508, 503, 507, 967, 482, 488, 478
See application file for complete search history.

(56) References Cited

U.S. PATENT DOCUMENTS

| 4,438,723 | A | * | 3/1984 | Cannella et al. | 118/718 |
|---|---|---|---|---|---|
| 4,659,401 | A | | 4/1987 | Reif et al. | 148/175 |
| 4,908,074 | A | * | 3/1990 | Hosoi et al. | 148/33.2 |
| 5,516,722 | A | | 5/1996 | Kim | 437/105 |
| 5,693,139 | A | * | 12/1997 | Nishizawa et al. | 117/89 |
| 5,772,757 | A | | 6/1998 | Saito | 117/84 |
| 5,893,962 | A | | 4/1999 | Mizuno et al. | 118/723 |

(Continued)

FOREIGN PATENT DOCUMENTS

| DE | 100 13 327 | 9/2000 |
|---|---|---|
| EP | 0 514 018 | 11/1992 |

(Continued)

*Primary Examiner*—B. William Baumeister
*Assistant Examiner*—Igwe U. Anya
(74) *Attorney, Agent, or Firm*—St.Onge Steward Johnston & Reens LLC

(57) ABSTRACT

The invention relates to a method and device for depositing several crystalline semiconductor layers on at least one semiconductor crystalline substrate. According to said method, gaseous parent substances are introduced into a process chamber of a reactor by means of a gas inlet organ, said substances accumulating, optionally after a chemical gas phase and/or surface reaction, on the surface of a semiconductor substrate that is placed on a substrate holder in the process chamber, thus forming the semiconductor layer. Said semiconductor layer and the semiconductor substrate form a crystal consisting of either one or several elements from main group V, elements from main groups III and V, or elements from main groups II and VI. In a first process step for depositing a first semiconductor layer, a first process gas consisting of one or several first parent substances is introduced into the process chamber, the decomposition products of said gas forming the crystal of a first semiconductor layer and small quantities of a second parent substance can be introduced into the process chamber in order to dope the first semiconductor layer. The invention is characterized in that in a second process step, prior to or after the first process step, a second process gas, which contains the second parent substance and optionally additional gases, is introduced into said process chamber in order to deposit a second semiconductor layer, the decomposition products of said gas forming a second semiconductor layer, having a crystal that differs from that of the first semiconductor layer, whereby small quantities of a first parent substance can be introduced into the process chamber in order to dope the second semiconductor layer.

11 Claims, 3 Drawing Sheets

U.S. PATENT DOCUMENTS

| | | | |
|---|---|---|---|
| 6,294,466 B1 * | 9/2001 | Chang | 438/680 |
| 6,312,987 B1 * | 11/2001 | Han et al. | 438/255 |
| 6,475,627 B1 * | 11/2002 | Ose | 428/446 |
| 6,592,771 B1 * | 7/2003 | Yamanaka et al. | 216/63 |
| 2003/0162370 A1 * | 8/2003 | Sukegawa et al. | 438/478 |

FOREIGN PATENT DOCUMENTS

| | | |
|---|---|---|
| EP | 1 039 512 | 9/2000 |
| JP | 61106495 | 5/1986 |
| JP | 03023298 | 3/1991 |
| WO | WO 01/65592 | 9/2001 |

* cited by examiner

METHOD AND DEVICE FOR DEPOSITING CRYSTALLINE LAYERS ON CRYSTALLINE SUBSTRATES

This application is a continuation of pending International Patent Application No. PCT/EP02/13830 filed Dec. 6, 2002 which designates the United States and claims priority of pending German Patent Application No. 101 63 394.7 filed Dec. 21, 2001.

The invention relates to a method for depositing a plurality of crystalline semiconductor layers on at least one crystalline semiconductor substrate, in which gaseous starting substances are introduced into a process chamber of a reactor through a gas inlet member, which starting substances, if appropriate after a chemical vapor phase or surface reaction, accumulate on the surface of a semiconductor substrate, which is disposed on a substrate holder in the process chamber, so as to form the semiconductor layer, the semiconductor layer and the semiconductor substrate forming a crystal, from either (a.) one or more elements from main group V,
  (b.) elements from main groups III and V, or
  (c.) elements from main groups II and VI, wherein, in a first process step for deposition of a first semiconductor layer, a first process gas consisting of one or more first starting substances is introduced into the process chamber, the decomposition products of which process gas form the crystal of a first semiconductor layer, and wherein, for the purpose of doping the first semiconductor layer, small quantities of a further starting substance can be introduced into the process chamber.

WO 01/65592A2 has disclosed a method in which gallium nitride or gallium arsenide is deposited on a silicon crystal by means of vapor phase epitaxy. The silicon crystal has the property denoted above by (a.). Gallium nitride or gallium arsenide has the property denoted above by (b.). Furthermore, it is known from the prior art to deposit silicon on silicon single crystals. This process too is carried out by means of vapor phase epitaxy. Whereas gaseous trimethylgallium and gaseous arsine are used as starting substances for the deposition of gallium arsenide, gaseous silane is used as the starting substance for the deposition of single-crystal silicon layers on silicon substrates. It is also possible to produce a crystal mixture of the crystal referred to above under (a.), for example a crystal mixture of germanium and silicon. In this case, in addition to the gaseous silane, gaseous germane is introduced into the process chamber through the gas inlet member. In this case, the process gas consists of two gaseous starting substances. A further starting substance may be added to this process gas in order to dope the silicon/germanium. Trimethylgallium or arsine are suitable as a further starting substance, which is only fed to the gas phase in very small traces, depending on whether gallium doping or arsenic doping is desired.

On the other hand, for the deposition of single-crystal gallium arsenide layers, wherein a two-component process gas is introduced into the gas phase to deposit a crystal characterized under (b.) above, a further starting substance can be admixed in only small traces to the process gas in order to dope the gallium arsenide crystal. This starting substance may be silane or germane. Unlike with the layer growth of silicon or silicon/germanium, however, silicon is only added to the process gas as a dopant for gas in extremely small masses, for example diluted a thousand times.

The invention is based on the object of further developing the process engineering of the known method and of providing an apparatus which can be used to carry out the method which has been developed in this way.

The achievement of this object is described in the claims.

In particular, it is provided that in a second process step before or after the first process step, a second process gas, which contains the second starting substance and if appropriate further gases, is introduced into the same process chamber in order to deposit a second semiconductor layer, the decomposition products of this second process gas forming a second semiconductor layer, having a crystal which differs from the crystal of the first layer, it being possible for small quantities of a first starting substance to be introduced into the process chamber for the purpose of doping the second semiconductor layer. The method according to the invention allows not only gallium arsenide layers to be deposited on silicon or silicon layers to be deposited on silicon, but also either gallium arsenide layers on silicon or silicon layers on gallium arsenide layers to be deposited in succession in a single process chamber. These layers may be deposited not only in undoped form but also in doped form. It is possible to deposit III–V layers on IV layers. Of course, the same also applies to II and VI layers. It is advantageously possible for both the gallium arsenide layers and the silicon layers to be doped by using the starting substance of in each case the other process gas as dopant. The apparatus according to the invention is distinguished by a correspondingly large number of gas feed lines leading to the gas inlet member. Since at least two starting substances can be used both to form crystals and for doping, optimum utilization of the sources of the starting substances is possible. This may reduce the production costs of both the apparatus and the semiconductor products. To regulate the gas quantities there are in particular gas mass flow regulators which can be used to regulate each individual gas flow. These gas mass flow regulators are preferably configured in such a way that they can be used to provide both the gas quantities required for layer growth of a first semiconductor layer and the gas quantities required just for doping of a second semiconductor layer. The crystal of at least one layer, for example silicon or germanium, may correspond to the crystal of the substrate, for example silicon. However, the substrate may also consist of gallium arsenide, indium phosphide or germanium. Then at least one layer consists of precisely this material. Advantageously at least one further layer has a crystal which differs from the crystal of the substrate. If the substrate is silicon then this layer may consist of gallium arsenide, indium phosphide or gallium indium arsenide phosphide or gallium nitride. It is preferable for at least one layer to include the same elements of which the substrate also consists, for example silicon. However, an oxide is also suitable for use as a layer with a crystal which differs from the crystal of the substrate. The transition region between a first and a second layer, for example silicon/germanium or gallium arsenide, may preferably form a monolayer solid solution. This formation of a monolayer solid solution in the transition region between the two layers means that the layers, which typically have different lattice constants, are bonded to one another without any defects. The layers of the different crystals may both be deposited immediately in succession, in which case only the composition of the gas phase is changed. However, it is also possible for an intermediate process step to be carried out between the two coating steps. This intermediate process step may be an etching step or a passivation step. In the etching step, a material of the preceding process gas which has been deposited on the substrate holder is removed. The etching-away of these parasitic growth products can be effected by introducing HCl into the process chamber. This is particularly advantageous if the material is gallium arsenide or another III-V compound. If the parasitic growth product of a silicon deposition step is to be removed, it is possible to use a plasma in which hydrogen radicals, chlorine radicals or fluorine radicals are generated. This plasma is ignited, for example, by a radiofrequency electromagnetic alternating field. This electromagnetic alternating field is preferably built up in a region outside the substrate, so that only the surface region of the substrate which adjoins the substrate is impaired by the radicals. This plasma can also be used to treat the walls and cover of the process chamber, so that deposits in those regions are also removed. However, it is also possible to carry out the etching step in such a way that the surface of the substrate is also etched. Although this leads to slight damage to the substrate surface or if appropriate to the surface of a previously deposited layer, slight surface damage of this nature may actually be of benefit to the bonding of the subsequent layer. Therefore, as it were, a nucleation layer is formed. This nucleation layer is also formed if an intermediate layer is deposited for passivation purposes instead of the etching step. In a preferred method variant, the process parameters, i.e. the gas flows and the temperatures inside the process chamber, are set in such a way that the parasitic growth is minimized. For this purpose, it is preferable for not just the substrate holder, but also the walls and cover of the process chamber, to be heated from below. The process chamber is preferably cylindrical in form. The gas inlet member is located in its center. The substrate holder is located directly opposite the gas inlet member and can be driven in rotation. Substrate carrier plates, which are themselves in turn driven in rotation, may be located in a planetary manner with respect to the substrate holder. The rotational drive for the substrate carrier plates may be effected in a known way by means of a corresponding gas cushion.

BRIEF DESCRIPTION OF DRAWINGS

Exemplary embodiments of the invention are explained below with reference to the appended drawings, in which.

DETAILED DESCRIPTION OF DRAWINGS

Figure 1:
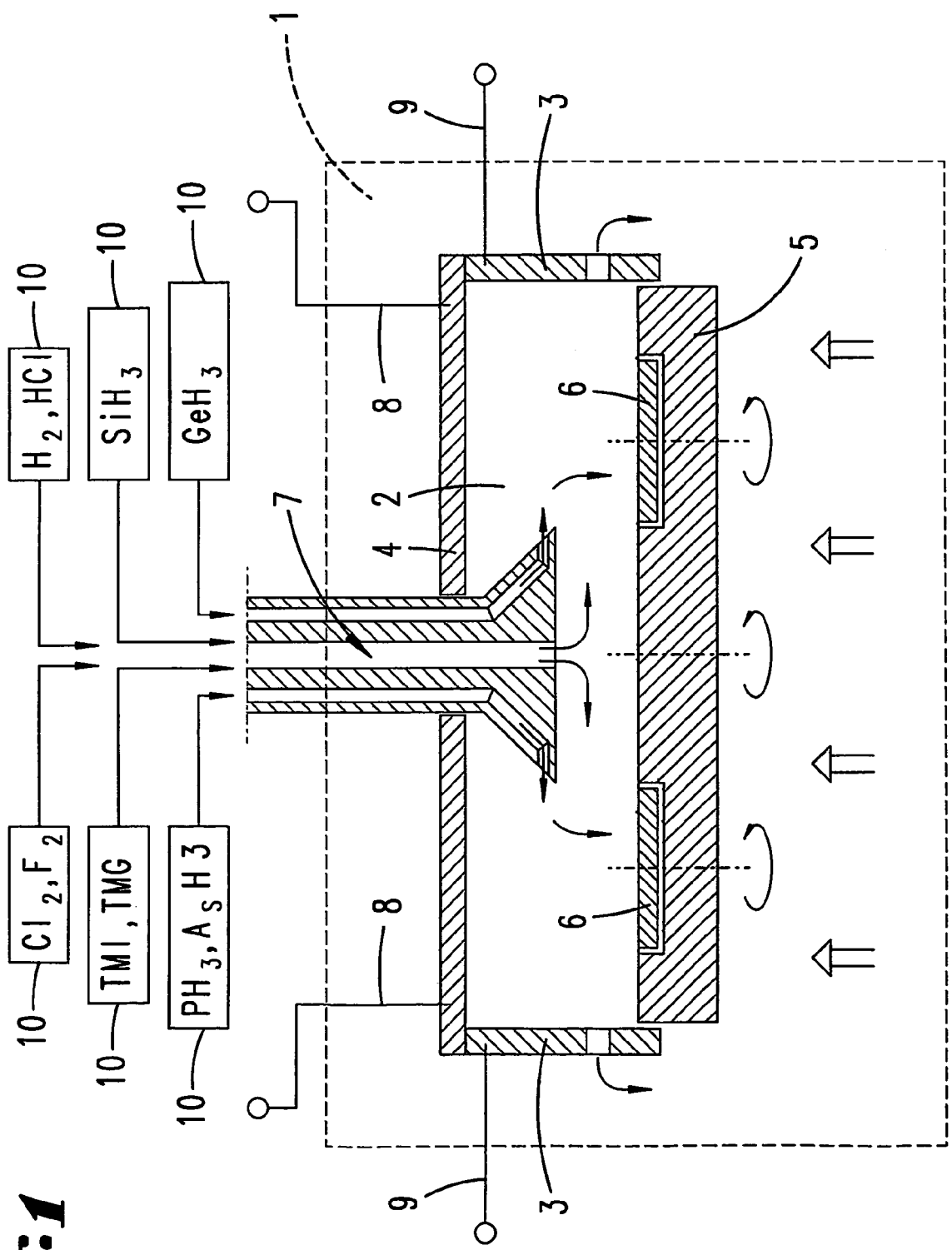
FIG. 1 shows a highly diagrammatic illustration of a process chamber in a reactor of a first exemplary embodiment.

The apparatus illustrated in FIG. 1 is the process chamber 2 of a reactor 1, which is only diagrammatically indicated. The process chamber 2 has a substrate holder 5 which extends in the horizontal plane and may consist, for example, of graphite or of coated graphite. This substrate holder 5 is rotationally driven in a known way. It rotates about its own axis. The substrate holder 5 is in the shape of a circular disk. Cylindrical substrate carrier plates 6, on which a substrate can be placed, are located in cylindrical pockets on the substrate holder. These substrate carrier plates 6 are driven in rotation by means of a gas cushion. In the process chamber, they rotate about their own axis.

A gas outlet member 7 opens out in the center of the process chamber 2. In the exemplary embodiment shown in FIG. 1, this gas outlet member 7 has two gas outlet openings, namely a peripheral outlet opening, through which, by way of example, trimethylgallium can enter the process chamber in gas form, and a central outlet opening, through which arsine can be introduced into the process chamber. The gas inlet member 7 projects through an opening in a process chamber cover 4 which extends parallel to the substrate holders. The periphery of the process chamber 2 is surrounded by an annular wall 3 which has gas outlet openings through which the process gas can emerge from the process chamber 2.

The substrate holder 5 is heated from below, for example by means of infrared radiation or by means of radio waves. The process chamber wall 3 and the process chamber cover 4 may also be heated. The heating of the process chamber wall and the process chamber cover serves to minimize the parasitic growth.

The process chamber cover 4 and the process chamber wall 3 may be configured to be electrically conductive. However, they may also have electrically conductive zones. These electrically conductive zones are connected to electrodes 8, 9. A radiofrequency electromagnetic alternating field can be connected to these electrodes, so that given a suitable vapor phase composition inside the process chamber 2 a plasma can form therein. This plasma generates hydrogen, chlorine or fluorine radicals, by means of which a silicon coating on the process chamber cover 4 or the process chamber wall 3 can be etched away. However, there is also provision for HCl to be introduced through the gas inlet member 7, by means of which a coverage of gallium arsenide on the process chamber wall and the process chamber cover 2 can be etched away. However, the introduction of HCl and/or the generation of the radicals also serves to etch the surface of the substrate holder 5. It is possible to partially etch both the surfaces of the substrate and of the layers deposited on the substrates.

Figure 2:
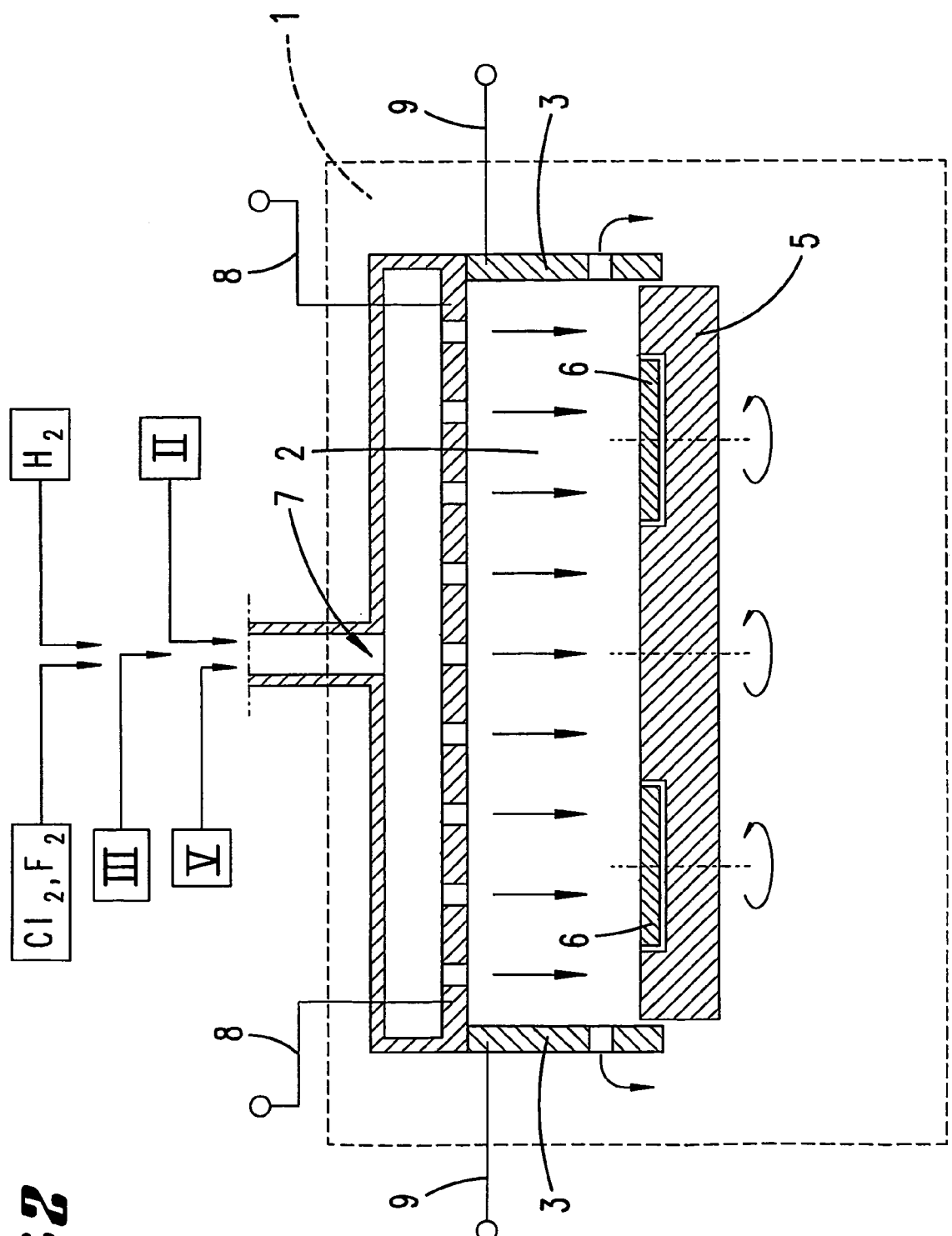
FIG. 2 shows a second exemplary embodiment of a process chamber in a reactor.

The exemplary embodiment illustrated in FIG. 2 differs from the exemplary embodiment illustrated in FIG. 1 substantially with regard to the shape of the gas inlet member 7. Whereas the gas inlet member 7 is a multi-passage gas inlet system, in which the passages are separated from one another up to their openings, the gas inlet member 7 illustrated in FIG. 2 is a type of "showerhead". This gas inlet system has a central chamber, from which a large number of openings disposed in grid form open out into the process chamber 2.

In FIG. 1, reference numeral 10 denotes various gas mass flow regulators. For example, the apparatus in each case has gas mass flow regulators for trimethylindium, trimethylgallium, phosphine, arsine, silane, germane, HCl, chlorine and fluorine, and also hydrogen. The gas mass flow regulators 10 may be of any desired structure. It is advantageous if a gas mass flow regulator 10 of at least one of the crystal-forming gases, for example trimethylindium, trimethylgallium, phosphine, arsine, silane or germane, is dimensioned in such a way that this starting substance can be used both as a crystal-forming starting substance and as a dopant. If this starting substance is used as a dopant, the gas mass flow regulator 10 passes a gas mass which is reduced by several powers of 10 into the gas inlet member 7. Reducing the gas mass flow of the corresponding starting substance to such an extent can be effected, for example, by suitable dilution. What is important, however, is that the starting substance in question can be used both to form crystals and in just trace form to dope a different crystal.

The method according to the invention is explained on the basis of the vertical layer structures illustrated in FIGS. 3 to 8. In the figures, the substrate material indicated is silicon, for the sake of simplicity.

Figure 3:
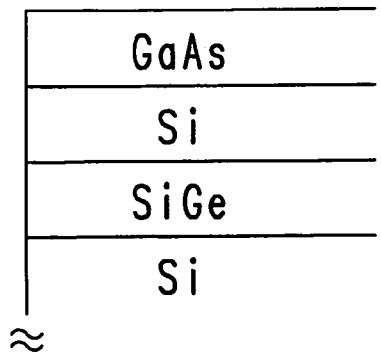
FIG. 3 to FIG. 8 show various layer structures produced using the method according to the invention.

To achieve the layer structure illustrated in FIG. 3, silicon/germanium is deposited on the silicon substrate in single crystal form. A silicon layer is deposited on this silicon/germanium layer. This is followed by deposition of gallium arsenide.

To deposit the silicon/germanium layer, the substrate holder 5 is heated to a temperature of approximately 1000° C. Then, silane and germane are introduced into the process chamber through the gas inlet member 7. A silicon/germanium layer is formed on the silicon substrate. Then, to deposit the silicon layer, silane alone is introduced into the process chamber 2 through the gas inlet member, so that the silicon layer is deposited. Parasitic growth leads to a small amount of material also being deposited on the wall 3 of the process chamber and/or the process chamber cover 4. The coverage is minimized there by the process chamber wall 3 and the reactor cover 4 also being heated.

After the silicon layer has been deposited, the parasitic deposits on the reactor wall 3 and the reactor cover 4 are etched away. This is effected by means of a hydrogen, chlorine or fluorine plasma. For this purpose, chlorine or HCl or fluorine or hydrogen is introduced into the process chamber. A plasma is ignited in the process chamber by means of the electrodes 8 and 9. The free radicals which are then formed etch away the deposits in the region of the plasma.

Alternatively, however, it is also possible to deposit a thin interlayer, for example of gallium arsenide, which passivates the parasitic deposits.

Figure 4:
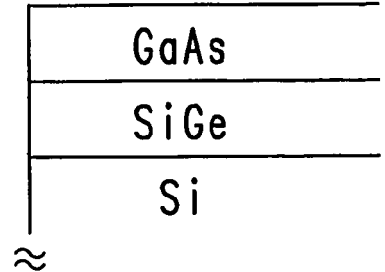

To achieve the layer structure illustrated in FIG. 4, likewise first of all silicon/germanium is deposited on the silicon substrate. Then, after an optional etching step or a passivation step, gallium arsenide is deposited on the silicon/germanium layer.

Figure 5:
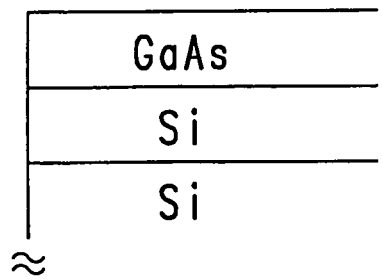

To achieve the layer structure illustrated in FIG. 5, after a silicon/buffer layer has been deposited on the silicon substrate, gallium arsenide is deposited. In this case too, the deposition of gallium arsenide may be preceded by an etching step or a passivation step.

Figure 6:
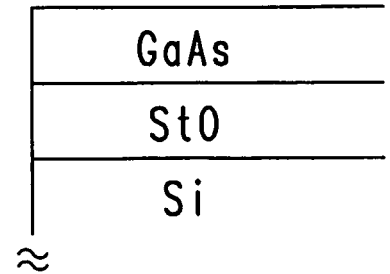

In the exemplary embodiment illustrated in FIG. 6, first of all an oxide layer is deposited on the silicon substrate. A gallium arsenide layer is deposited on this oxide layer.

Figure 7:
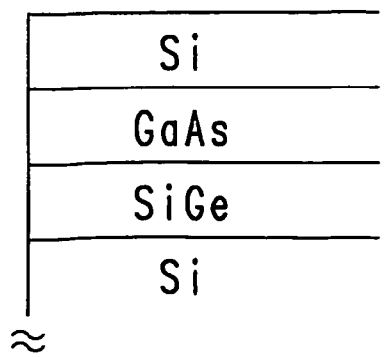

In the exemplary embodiment illustrated in FIG. 7, gallium arsenide is deposited on a silicon/germanium layer deposited on the substrate. This gallium arsenide layer is then covered with a silicon layer. A further etching or passivation step may be carried out before the silicon covering layer is deposited. HCl can be introduced into the reactor in order to remove the gallium arsenide which has been parasitically deposited on the process chamber wall 3, the substrate holder 5 or the reactor cover 4. This HCl etches away the parasitically grown gallium arsenide. This etching step may even partially etch the gallium arsenide layer itself.

In a variant, the deposition of the silicon covering layer is preceded by the deposition of a passivation layer, so that it is impossible for any gallium or arsenide to be vaporized out of the gallium arsenide deposits.

Figure 8:
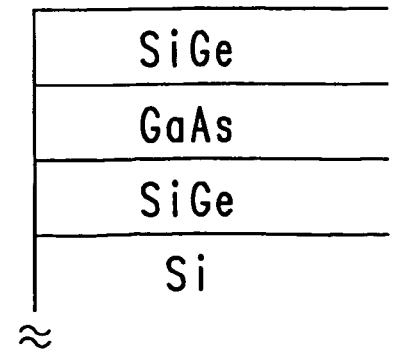

In the exemplary embodiment illustrated in FIG. 8, first of all silicon/germanium is deposited on the silicon substrate. This layer is followed by a gallium arsenide coating. The covering layer provided in this case is silicon/germanium.

The method according to the invention is effected by loading a reactor with one or more substrates. The substrates are, for example, laid onto the substrate carrier plates 6. However, it is also possible to lay just one substrate onto a non-rotatable substrate holder. After the reactor has been closed, the process chamber is heated to the deposition temperature for silicon. This deposition temperature may be approximately 1000° C. Then, silane is introduced into the process chamber 2 through the gas inlet member 7. The gas mass flow of the silane is set by means of the gas mass flow regulator 10. The gas mass flow is set to be sufficient to effect correspondingly extensive layer growth.

After the silicon layer has been deposited, the silane flow is set to zero.

Alternatively, it is also possible to introduce a mixture of germane and silane into the vapor phase instead of pure silane, so that a silicon-germanium layer grows onto the substrate. In an alternative, it is also possible to introduce an oxide-forming material (FIG. 6). During the deposition of the silicon layer, silane is used as starting substance to build up the layer. In addition to this silane, it is also possible for arsine or trimethylgallium or alternatively phosphine or trimethylindium to be introduced into the process chamber 2 through the gas inlet member 7. The mass flow of this second starting substance is, however, considerably lower, for example by a factor of 1000, than the mass flow of silane, and consequently this second starting substance does not build up the crystal, but rather is only responsible for doping the crystal.

After this first semiconductor layer has been deposited from silane or a silane/germane mixture as first process gas, it is possible to deposit a second semiconductor layer. This is effected by introducing a second starting substance and in particular a mixture of two second starting substances into the process chamber as process gas. The second process gas is then formed by a mixture of arsine or trimethylgallium or phosphine and trimethylindium or a mixture of all four second starting substances. This second process gas is then introduced into the process chamber 2 through the gas inlet member 7 at a reduced deposition temperature. In this way, a III-V layer is deposited on the substrates or on the previously deposited layers of silicon or silicon/germanium. This layer has a different crystal than the IV crystal layer consisting of silicon or silicon/germanium. During the deposition of the III-V layer, it is also possible for silane to be introduced into the process chamber in addition to the abovementioned crystal-forming starting substances. Now, however, the gas mass flow of the silane is considerably lower than the gas mass flow of, for example, arsine and trimethylindium. This means that the layer substantially comprises gallium arsenide and only includes traces of silicon. In this case, silicon is only a dopant.

Alternatively, it is possible to incorporate an intermediate etching step after the deposition of the first layer. In this intermediate etching step, the process chamber wall 3, the process chamber cover 4 and regions of the substrate holder 5 are etched. Any substances which may have been deposited during deposition of the silicon layer or there are removed during the etching step. This etching step may even partially etch the surface of the silicon layer. A plasma is preferably used to etch away parasitic silicon. For this purpose, fluorine, chlorine or HCl is introduced into the vapor phase. On account of a radiofrequency electromagnetic alternating field, radicals are formed from these gases and remove deposits from the process chamber wall 3 and the process chamber cover 4.

However, as an alternative to the etching step, it is also possible to deposit an interlayer. In this case, this interlayer is deposited in such a way that primarily the process chamber wall 3 and the process chamber cover 4 are covered. Then, the temperature of the process chamber wall 3 and/or the process chamber cover 4 is controlled in a suitable way. The process parameters are selected in such a way that as little material as possible is deposited on the process chamber wall and the process chamber cover during the step of coating the substrate. In the intermediate coating step, however, the process parameters are set in such a way that substantially only the deposits are coated.

Pure HCl without plasma can be used to remove parasitic growth of gallium arsenide or indium phosphide. In this case too, it is possible to accept the fact that the etching step will not only remove the deposits from the process chamber wall and the process chamber cover but also will partially etch the layer surface on the substrate. This is particularly advantageous if the coating is to take place with the formation of monolayer solid solutions between the individual layers. The formation of a monolayer solid solution in the transition region is of particular benefit to the bonding of the layers on one another and/or to defect-free growth.

However, as an alternative to III-V compound semiconductors, it is also possible to deposit II-VI compound semiconductors.

All the features disclosed are (inherently) pertinent to the invention. The content of disclosure of the associated/appended priority documents (copy of the prior application) is hereby incorporated in its entirety in the disclosure of the application, partly with a view to incorporating features of these documents in claims of the present application.

What is claimed is:

1. Method for depositing a plurality of crystalline semiconductor layers on at least one crystalline semiconductor substrate, in which gaseous starting substances are introduced into a process chamber of a reactor through a gas inlet member, which starting substances, if appropriate after a chemical vapor phase and/or surface reaction, accumulate on the surface of a semiconductor substrate, which is disposed on a substrate holder in the process chamber, so as to form the semiconductor layer, the semiconductor layer and the semiconductor substrate forming a crystal, from either
    (a) one or more elements from main group V,
    (b) elements from main groups III and V, or
    (c) elements from main groups II and VI,
    wherein, in a first process step for deposition of a first semiconductor layer, a first process gas consisting of one or more first starting substances is introduced into the process chamber, the decomposition products of which process gas form the crystal of a first semiconductor layer, and wherein, for the purpose of doping the first semiconductor layer, small quantities of a second starting substance can be introduced into the process chamber, characterized in that, in a second process step before or after the first process step, a second process gas, which contains the second starting substance and if appropriate further gases, is introduced into the same process chamber in order to deposit a second semiconductor layer, the decomposition products of this second process gas forming a second semiconductor layer, having a crystal which differs from the crystal of the first semiconductor layer, it being possible for small quantities of a first starting substance to be introduced into the process chamber for the purpose of doping the second semiconductor layer.

2. Method according to claim 1, characterized in that the crystal of at least one layer corresponds to the crystal of the substrate, and at least one layer comprises a crystal which differs from the crystal of the substrate.

3. Method according to claim 2, characterized in that at least one layer is formed by the same elements as those of which the substrate consists.

4. Method according to claim 3, characterized in that the substrate is silicon.

5. Method according to claim 4, characterized in that at least one of the layers is gallium, arsenide, gallium nitride or silicon, silicon/germanium or an oxide.

6. Method according to claim 5, characterized in that a transition region between a first and a second layer forms a monolayer solid solution.

7. Method according to claim 6, characterized in that the second layer is deposited directly on the first layer.

8. Method according to claim 7, characterized in that decomposition products of the first or second process gas which are deposited on the substrate holder, the process chamber wall, the process chamber cover are either removed or passivates after the deposition of the associated first or second layer.

9. Method according to claim 8, characterized in that the removal of material is effected by etching using in particular HCl or a plasma.

10. Method according to claim 9, characterized in that the plasma, which consists in particular of hydrogen, chlorine or fluorine radicals, is generated remotely from the substrate.

11. Method according to claim 10, characterized in that the substrate surface or the surface of a previously deposited layer is also etched.

* * * * *